Figure 1:
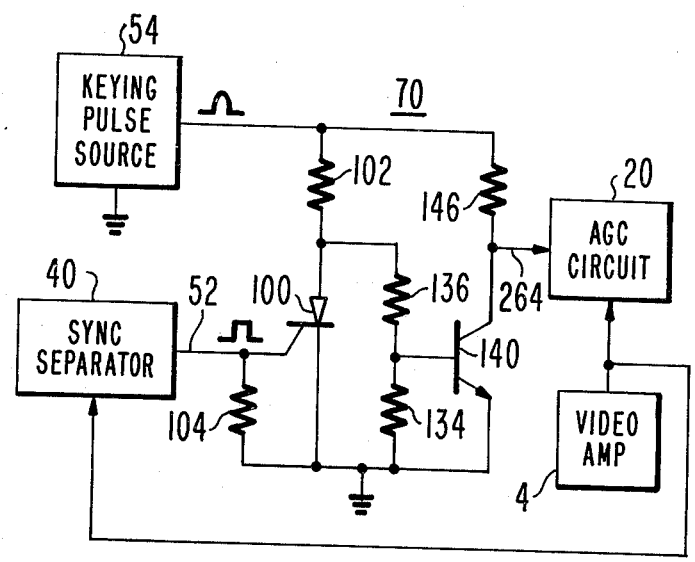

United States Patent [19]

Harford

[11] 4,213,151
[45] Jul. 15, 1980

[54] AGC KEYING SIGNAL CIRCUIT

[75] Inventor: Jack R. Harford, Flemington, N.J.

[73] Assignee: RCA Corporation, New York, N.Y.

[21] Appl. No.: 934,835

[22] Filed: Aug. 18, 1978

[51] Int. Cl.² ............................................. H04N 5/52
[52] U.S. Cl. ............................................. 358/178
[58] Field of Search ....................... 358/174, 176, 178

[56] References Cited

U.S. PATENT DOCUMENTS

| 3,624,290 | 11/1971 | Hofmann | 358/178 |
| 3,740,471 | 6/1973 | Wilcox | 358/178 |

*Primary Examiner*—Richard Murray
*Attorney, Agent, or Firm*—Eugene M. Whitacre; William H. Meagher; W. Brinton Yorks, Jr.

[57] ABSTRACT

An automatic gain control keying signal circuit is provided for generating an automatic gain control (AGC) keying signal for a television AGC circuit. A keying signal is produced upon the normal coincidence of a sync pulse from the sync separator and a horizontal retrace pulse from the horizontal deflection system in a television receiver. The keying signal begins upon coincidence of the sync pulse and the horizontal retrace pulse and ends upon termination of the retrace pulse, thereby producing a keying signal pulse of substantially constant time duration, irrespective of the duration of the sync pulse. According to a further aspect of the invention, an "out-of-lock" signal is produced upon the occurrence of a horizontal retrace pulse which is not in coincidence with a sync pulse.

12 Claims, 2 Drawing Figures

AGC KEYING SIGNAL CIRCUIT

This invention relates to an automatic gain control (AGC) keying signal circuit which produces a keying pulse signal for an automatic gain control circuit upon the coincidence of a sync pulse and a horizontal flyback (retrace) pulse in a television receiver.

AGC circuits are commonly used in television receivers to derive a suitable control voltage for application to the radio frequency (RF) and intermediate frequency (IF) amplifier stages of the receiver. The control voltage is effective to vary the gain of the stages inversely in accordance with the level of the synchronizing pulse components of a detected video signal so as to provide a constant peak amplitude of the detected television signal.

It is customary in television receivers to derive the AGC control voltage by sampling the peak level of the synchronizing pulse components of the composite video signal and adjusting the control voltage in response to changes in the signal level. A peak detector may be utilized to sample the sync pulses, but because it is quite susceptible to impulse noise, means are generally provided to gate "on", or key, the AGC circuit only during the relatively short horizontal retrace (flyback) pulses produced by the horizontal deflection system. In his way, amplitude variations of the video signal during the remainder of the line scanning period cannot affect the operation of the AGC circuit.

The synchronizing pulse components of the composite video signal are normally separated from the video signal in a television receiver by a sync separator. The separated sync signals are then coupled to a phase-locked loop circuit, where they are compared with a local oscillator signal to generate horizontal deflection signals and retrace pulses in a transformer associated with the horizontal deflection system. In normal operation, the phase-locked loop circuit ensures that the horizontal retrace pulses occur in a substantially constant phase relationship with the sync signals.

However, if the sync separator fails to produce an accurate sync signal due to noise in the video signal or the reception of a video signal which is too strong or too weak, an "out-of-lock" condition will occur as the free-running signal produced by the phase-locked loop circuit drifts out of synchronization with the video signal. The out-of-lock horizontal retrace pulse generated by the horizontal deflection circuit will then key the AGC circuit into operation at a time when the video information portion of the composite video signal is coupled to the AGC circuit. The AGC circuit will thus sample the video signal level, instead of the tips of the sync signals, resulting in the production of an inaccurate AGC control voltage. It is therefore desirable to key the AGC circuit into operation only when the sync and horizontal retrace pulses are in synchronism with each other.

Moreover, the AGC keying signal should have a constant duty cycle. If the pulse width of the keying signal varies with the sync pulse width, for instance, the AGC control voltage could be amplitude modulated according to the keying signal pulse width. The AGC circuit could fail to sample the maximum peak level of narrow equalizing pulses, while sampling the full peak level of the broad vertical pulses in the video signal. This would result in the appearance of a light stripe along the top of the television image.

Furthermore, it is desirable to key the AGC circuit into operation when an out-of-lock condition is caused by the reception of an excessively strong video signal so that the AGC control voltage is quickly modified to reduce the gain of the RF and IF amplifying stages. Likewise, when the out-of-lock condition is caused by the reception of a very weak video signal, it is desirable both to increase the gain of the RF and IF amplifying stages and to enable detection of the sync signal components of the lower level video signal by the sync separator.

In accordance with the present invention, an AGC keying signal circuit is provided which is responsive to the coincidence of a sync pulse and a horizontal retrace pulse for the generation of an AGC keying signal. The keying signal begins upon coincidence of a sync pulse and a horizontal retrace pulse, and ends upon termination of the retrace pulse, thereby producing AGC keying pulses having substantially constant pulse widths. The keying signal may be applied to an AGC circuit, which samples the sync pulse tips during the keying pulse intervals In a preferred embodiment of the present invention, the AGC keying signal circuit further includes means for generating a second keying signal upon reception of a horizontal retrace pulse which is not in coincidence with a sync pulse. Means are also provided for enabling a sync separator recovery circuit during this out-of-lock condition, which increases the sensitivity of the sync separator so as to detect a weaker video signal.

Figure 2:
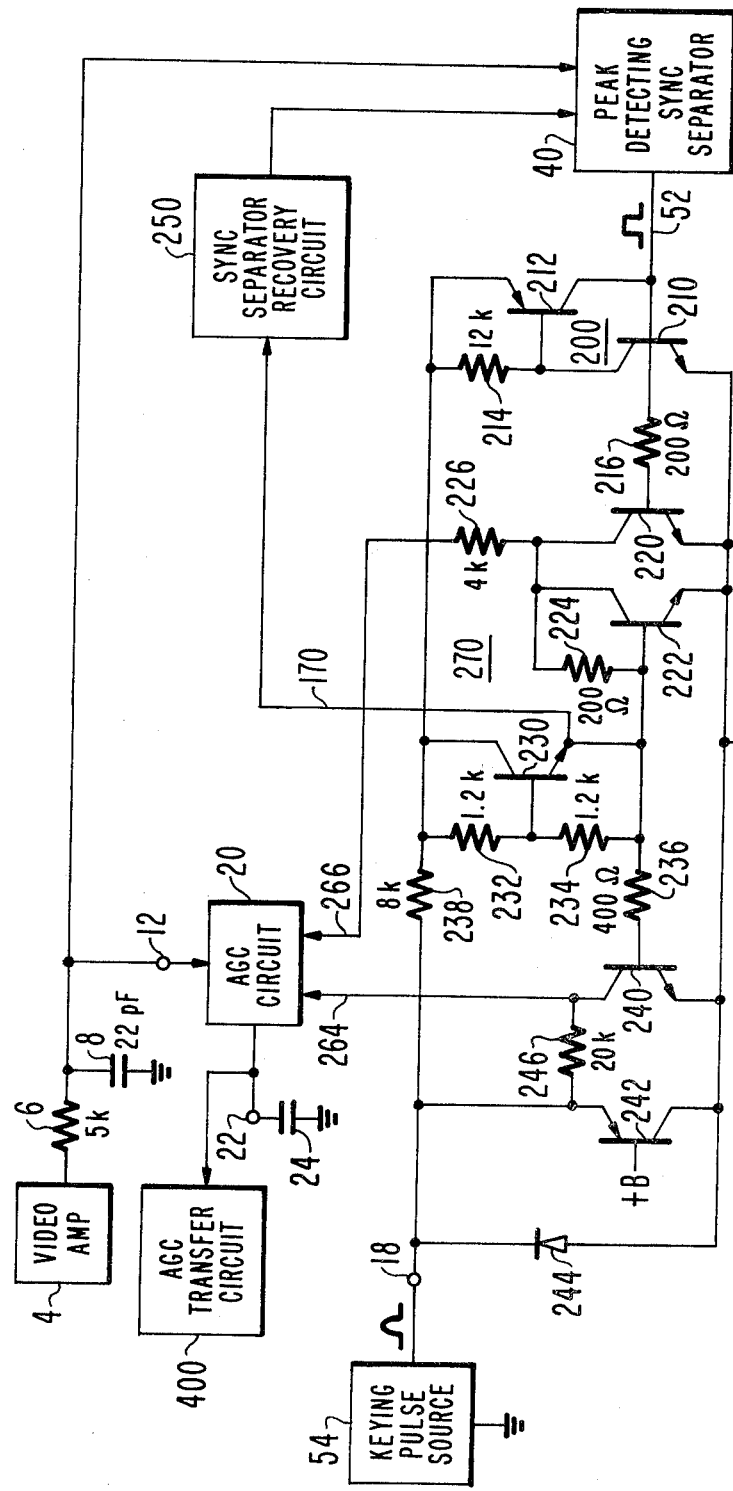

In the accompanying drawings:

FIG. 1 illustrates, partially in block diagram form an partially in schematic diagram form, an AGC keying signal circuit constructed in accordance with the principles of the present invention; and FIG. 2 illustrates, partially in block diagram form and partially in schematic diagram form, a second AGC keying signal circuit constructed in accordance with the principles of the present invention.

Referring to FIG. 1 of the drawings, an AGC keying signal circuit 70 including an SCR latching device 100 is illustrated in the schematic portion of the drawings. The keying circuit 70 receives sync signal pulses on conductor 52 from a sync separator 40, which separates the synchronizing signal components from a composite video signal provided by a video amplifier 4. The sync signal comprises pulses of varying time duration, ranging from 2.5 microsecond equalizing pulses to 29 microsecond broad vertical pulses. The sync signal pulses are also coupled to the horizontal deflection system of the television receiver (not shown), where they are locked in phase with a local oscillator for the generation of horizontal deflection and retrace pulses. The keying circuit 70 also receives horizontal retrace pulses from a keying pulse source 54, which supplies recurrent flyback voltage pulses derived, for example, from a transformer associated with the horizontal deflection system. The sync pulses and the horizontal retrace pulses thus occur in synchronism during normal operation of the television receiver.

The horizontal retrace pulses from keying pulse source 54 are coupled to the keying circuit by two resistors 102 and 146. Resistor 146 couples the retrace pulses to an output conductor 264, which provides AGC keying pulses to an AGC circuit 20. The AGC circuit 20 is keyed into operation by the keying pulses to sample the level of the composite video signal provided by video amplifier 4. The AGC circuit produces an AGC control voltage which corresponds to the sample video sync tip level.

Resistor 102 couples the horizontal retrace pulses to the anode of an SCR 100, and to the base of a transistor 140 through a resistor 136. The base of transistor 140 is biased by the connection of a resistor 134 from the base electrode to a source of reference potential (ground). Transistor 140 has an emitter electrode coupled to ground and a collector electrode coupled to output conductor 264.

The sync pulses provided by the sync separator 40 are coupled by conductor 52 to the gate electrode of SCR 100. Conductor 52 is biased by the connection of a resistor 104 between the conductor and ground. The cathode of SCR 100 is coupled to ground.

In normal operation, a horizontal retrace pulse is coupled to the anode of SCR 100 and conductor 264 concurrently with the coupling of a sync pulse to the gate of the SCR. The coincidence of the two pulses at the electrodes of the SCR switches the SCR into conduction, thereby reducing the potential at its anode electrode. This low anode potential is applied to the base of transistor 140 by resistor 136, maintaining that transistor in a nonconducting condition. Since transistor 140 is not conducting, the retrace pulse which is coupled to conductor 264 by resistor 146 is conducted to AGC circuit 20 to key the AGC system into operation.

However, if the horizontal retrace pulses and the sync pulses are out of synchronization for any reason, no keying pulses are coupled to the AGC circuit 20. If a sync pulse is applied to the gate of the SCR unaccompanied by a horizontal retrace pulse at the anode electrode, no conduction current will be available for the SCR and it will not latch. If a horizontal retract pulse is coupled to the anode of the SCR unaccompanied by a sync pulse at gate electrodes, the SCR will not be gated on. If the SCR 100 is not latched, the horizontal retrace pulse at the anode of the SCR is coupled to the base of transistor 140, causing that transistor to conduct. Transistor 140 thus shorts conductor 264 to ground through its collectorto-emitter path, thereby preventing keying of AGC circuit 20 by the horizontal retrace pulse from the resistor 146.

It should be noted that anode to cathode current for SCR 100 is provided by the retrace pulse and gate current for the SCR is provided by the sync pulse. Although the SCR 100 will not conduct unless pulses are present at both its anode and gate electrodes, once conduction has started, it will continue until the anode current is terminated at the end of the horizontal retrace pulse. Thus, the SCR will remain latched for the duration of the horizontal retrace pulse regardless of the duration of the sync pulse, and transistor 140 will be turned off as long as the SCR is latched. Since the retrace pulses have a constant duration of approximately 12 microseconds, it is seen that the duration of the AGC keying pulse on conductor 264 is maintained constant by the constant pulse width of the horizontal retrace pulses.

An AGC system including an AGC keying signal circuit 270 incorporating the principles of the present invention is illustrated in FIG. 2. A composite video signal from a video amplifier 4 is coupled to an AGC circuit 20 and a peak detecting sync separator 40 by a low pass filter comprising a series resistor 6 and a shunt capacitor 8. The AGC circuit 20 is keyed by a signal on conductor 264 to sample the synchronizing signal components of the composite video signal. The AGC circuit develops an AGC control voltage on an AGC filter capacitor 24, which maintains the signal level of the sync signal components. The AGC control voltage is distributed to the RF and IF amplifying stages of a television receiver (not shown) by an AGC transfer circuit 400 to vary the gain of these stages in accordance with the level of the composite video signal. The AGC circuit 20 receives an out-of-lock signal on conductor 266 which acts to alter the AGC control voltage in a direction which increases the gain of the RF and IF amplifying stages. The out-of-lock signal is used to prevent the AGC circuit 20 from slipping into an AGC lockout condition, in which the AGC control will continuously defeat the reception of a very weak video signal. AGC circuit 20 is described in further detail in my copending U.S. patent application, Ser. No. 934,823, entitled "Keyed AGC Circuit," filed concurrently herewith.

Sync separator 40 receives the composite video signal from video amplifier 4 and separates the synchronizing signal components from the video information. The sync separator 40 includes a peak detecting circuit for detecting and storing the peak amplitudes of the synchronizing signal components. In normal operation, the sync signal produced by the sync separator 40 on conductor 52 comprises a sequence of periodic horizontal sync, equalizing, and broad vertical pulses ranging in duration from 2.5 microseconds (equalizing pulses) to 29 microseconds (broad vertical pulses). Sync separator 40 receives another input from a sync separator recovery circuit 250, which alters the signal level stored by the peak detecting circuit to enable the sync separator to separate low level synchronizing signal components from a weak video signal. The sync separator recovery circuit only operates when pulsed by a signal at its input from conductor 170. Sync separator 40 and sync separator recovery circuit 250 are described in further detail in my copending U.S. patent application, Ser. No. 934,821, entitled "Synchronization Signal Separator Circuit," filed concurrently herewith.

The AGC keying circuit 270 is illustrated in schematic detail in FIG. 2. The sync signal produced by sync separator 40 is coupled to the base of transistor 210, the collector of transistor 212, and the base of transistor 220 by way of resistor 216. Transistors 210 and 212 are connected to form a latching device 200 which may be easily implemented in integrated circuit form. The emitter of transistor 210 is coupled to a source of reference potential (ground) and its collector is coupled to the base of transistor 212. Resistor 214 connects the base of transistor 212 to its emitter electrode. The emitter of transistor 220 is coupled to ground, while its collector electrode is coupled to the junction of resistors 226 and 224, and the collector of transistor 222.

Horizontal retrace pulses from keying pulse source 54, which has been described in the discussion of FIG. 1, are coupled to AGC keying circuit 270 at terminal 18. A diode 244 has its anode electrode coupled to ground and its cathode electrode coupled to terminal 18 and acts to protect the AGC keying circuit from negative excursions of the horizontal retrace pulse. Such negative excursions could adversely affect the AGC circuit, for example, by causing parasitic carrier injection by transistor 230 into the AGC circuit 20 through transistor 240.

A transistor 242 has its emitter electrode coupled to terminal 18 and its collector electrode coupled to ground. The base electrode of transistor 242 is coupled to a source of supply voltage (+B). Transistor 242 acts to clamp the D.C. voltage level at terminal 18 at one $V_{be}$ above the voltage level of the +B supply during the horizontal retrace pulse.

A resistor 246 couples the horizontal retrace pulses at terminal 18 to the collector of a transistor 240 and AGC circuit 20 by way of conductor 264. Resistor 238 couples the horizontal retrace pulses to the latching device 200 at the emitter of transistor 212. Resistor 238 also couples the horizontal retrace pulses to the collector of a transistor 230 and the base of transistor 230 by way of a resistor 232. The emitter of transistor 230 is coupled to the base of a transistor 222 and to the base of transistor 240 by way of resistor 236. The collector-to-emitter path of transistor 240 is coupled between conductor 264 and ground. The emitter of transistor 230 is also coupled to the sync separator recovery circuit 250 by conductor 170. Resistor 234 is coupled between the base and emitter electrodes of transistor 230.

Transistor 222 is coupled in a diode configuration, with its emitter electrode coupled to ground and a resistor 224 coupled between its base and collector electrodes. The collector of transistor 222 is coupled to AGC circuit 20 by a resistor 226 and conductor 266.

In normal operation, a horizontal keying pulse is applied to terminal 18 concurrent with the arrival of a sync pulse at the base of transistor 210. The sync pulse turns on transistor 210, which in turn causes transistor 212 to conduct. Current from the horizontal retrace pulse is coupled to the emitter of transistor 212 to maintain the conduction of transistors 210 and 212. The sync pulse also turns on transistor 220, preventing any current flow to AGC circuit 20 through conductor 266. The conduction of collector current in transistor 220 through resistor 224 and away from the base of transistor 240 maintains transistor 240 in a nonconducting state. Since transistor 240 is turned off, the horizontal retrace pulse will be conducted to AGC circuit 20 through resistor 246 and conductor 264 and the AGC circuit will be keyed into operation.

The low potential applied to the base of transistor 240 by the conduction of transistor 220 is also directly coupled to conductor 170 at the emitter of transistor 230, thereby preventing the sync separator recovery circuit 250 from altering the signal stored by the peak detector in sync separator 40. Since the sync separator has properly separated the sync signal under these conditions, as indicated by the condition of the latching device 200, it is not necessary to alter the operation of the sync separator.

It is seen that transistors 210 and 212 provide for the transmission of a keying signal of constant pulse width to the AGC circuit. This is because transistors 210 and 212 will continue to conduct, or remain latched, for the duration of the horizontal retrace pulse which is applied to resistor 214 and the emitter of transistor 212. Once the latching device 200 has been latched by the presence of a sync pulse at the base of transistor 210, base current for this transistor will be supplied by current from the horizontal retrace pulse which is conducted to the base of transistor 210 by the emitter-to-collector path of transistor 212. Even after a 2.5 microsecond equalizing pulse or a 5 microsecond horizontal sync pulse has ended, transistors 210 and 212 will remain latched due to this current from the 12 microsecond horizontal retrace pulse. Moreover, the latching device 200 will stop conducting after the horizontal retrace pulse has ended, even if the pulse at the base of transistor 210 is a 29 microsecond broad vertical pulse, because collector current for transistor 210 and emitter current for transistor 212 is no longer available. Transistors 210 and 212 thus ensure that a constant duration keying pulse signal is coupled to AGC circuit 20, regardless of the duration of the sync pulse provided by sync separator 40.

When the keying pulse and the sync pulse are out of synchronization, the AGC circuit will not be keyed into operation. Instead, an out-of-lock signal will be coupled to the AGC circuit 20 through conductor 266 to cause the AGC filter capacitor to discharge slightly toward ground, thereby increasing the gain in the television receiver. This operation occurs as follows.

The arrival of a sync pulse at the base of transistor 210 without the concurrence of a horizontal retrace pulse at terminal 18 will not latch transistors 210 and 212. Transistor 210 will try to turn on, but since no keying pulse current is available at its collector or at the emitter of transistor 212, the transistors will not latch. Obviously, it is not possible to key the AGC circuit 20 under these conditions, since no horizontal retrace pulse is present at terminal 18 for transmission to the AGC circuit by conductor 264.

When a horizontal retrace pulse is supplied to terminal 18 unaccompanied by a sync pulse at the base of transistor 210, transistors 230 and 240 prevent transmission of the horizontal retrace pulse to the AGC circuit. Current from the horizontal retrace pulse is coupled by resistor 238 to latching device 200, but since the device is not latched by concurrent sync and retrace pulses, no current is conducted by the latching device. Instead, the retrace pulse is coupled to the base and collector of transistor 230, thereby causing that transistor to conduct. The horizontal retrace pulse is then conducted through the collector-emitter path of transistor 230 and into the base of transistor 240, causing that transistor to conduct. The horizontal retrace pulse at the junction of resistor 246 and conductor 264 will thus be conducted to ground by transistor 240, preventing the transmission of a keying pulse to AGC circuit 20.

Horizontal retrace pulse current conducted by transistor 230 is also coupled to resistor 224 and the base of transistor 222, causing transistor 222 to conduct. The retrace pulse is coupled to AGC circuit 20 from the emitter of transistor 230 by resistors 224 and 226 and conductor 266, attenuated considerably by the conduction of transistor 222. This out-of-lock signal causes AGC circuit 20 to discharge the AGC filter capacitor toward ground to gradually increase the gain of the RF and IF amplifying stages.

Horizontal retrace pulse current at the emitter of transistor 230 is also coupled by conductor 170 to activate the sync separator recovery circuit 250. Sync separator recovery circuit 250 alters the signal level stored by the peak detector circuit in the sync separator 40 so that the peak detector will quickly detect the sync signal components of a lower level video signal. Sync separator recovery circuit 250 thus enables the sync separator to recover from an out-of-lock condition caused by a weak video signal faster than its normally slow operation will permit.

An out-of-lock condition may occur if the television receiver suddenly receives a very strong video signal. Under these conditions, the video signal which is applied to the sync separator 40 may be limited by previous signal processing stages (not shown) and appear as a constant D.C. signal at the input to the sync separator, devoid of any synchronization signal information. The peak detecting sync separator 40 will respond to this input signal by generating a steady "high" sync signal on conductor 52. This signal maintains transistor 220 in a conducting condition, which in turn prevents transistor 240 from turning on and blocking keying pulses on conductor 264. The high sync signal will gate the latching device 200 into conduction upon the occurrence of every horizontal retrace pulse, thereby keying the AGC circuit into operation by the repeated conduction of keying signals on conductor 264. The AGC circuit 20 will thus quickly reduce the gain of the RF and IF amplifying stages in response to the strong video signal coupled from video amplifier 4, assuring prompt restoration of normal signal levels in the television receiver.

The continuous conduction of transistor 220 prevents the transmission of any out-of-lock signals to AGC circuit 20 on conductor 266. This prevents any undesirable increase in RF and IF gain due to these keying pulses. Conduction by transistor 220 also prevents any activation of the sync separator recovery circuit by a pulse on conductor 170, which would adversely adjust the sync separator for the detection of weak, rather than strong, video signals.

What is claimed is:

1. In an automatic gain control circuit of the type including an automatic gain control voltage generator keyed by a keying signal and responsive to the signal level of synchronizing signal components of a composite video signal for providing a gain control potential, an automatic gain control keying signal circuit comprising:
   a source of synchronizing signals comprising pulses of different time duration;
   a source of recurrent pulses normally in a substantially constant phase relationship with said synchronizing signal pulses, said recurrent pulses having a substantially constant time duration which is longer than the shortest duration ones of said synchronizing pulses;
   a controlled current path responsive to said synchronizing signal pulses and said recurrent pulses which is rendered conductive upon the coincidence of a synchronizing signal pulse and a recurrent pulse and which ceases conduction only upon the termination of said recurrent pulse; and
   means for generating a keying signal for said automatic gain control voltage generator in response to conduction by said controlled current path.

2. In an automatic gain control circuit of the type including an automatic gain control voltage generator keyed by a keying signal and responsive to the signal level of synchronizing signal components of a composite video signal for providing a gain control potential, an automatic gain control keying signal circuit comprising:
   a source of synchronizing signals comprising pulses of different time duration;
   a source of recurrent pulses normally in a substantially constant phase relationship with said synchronizing signal pulses, said recurrent pulses having a substantially constant time duration which is longer than the shortest duration ones of said synchronizing pulses;
   a silicon controlled rectifier having an anode to cathode path coupled to said source of recurrent pulses and a gate electrode coupled to said synchronizing signal source, wherein said silicon controlled rectifier is gated into conduction by the coincidence of a recurrent pulse and a synchronizing pulse;
   means for coupling said source of recurrent pulses to said automatic gain control voltage generator; and
   means having an input coupled to said anode to cathode path of said silicon controlled rectifier and an output coupled to said coupling means for disabling said coupling means when said silicon controlled rectifier is not conducting current.

3. The automatic gain control circuit of claim 2, wherein:
   the anode of said silicon controlled rectifier is coupled to said source of recurrent pulses and the cathode of said silicon controlled rectifier is coupled to a source of reference potential;
   said coupling means comprises a resistor; and
   said disabling means comprises a transistor having a base electrode coupled to the anode of said silicon controlled rectifier, an emitter electrode coupled to said source of reference potential, and a collector electrode coupled to said resistor,
   wherein said transistor is rendered conductive when said silicon controlled rectifier is not conducting current to prevent the coupling of a keying signal to said automatic gain control voltage generator by said resistor.

4. In an automatic gain control circuit of the type including an automatic gain control voltage generator keyed by a keying signal and responsive to the signal level of synchronizing signal components of a composite video signal for providing a gain control potential, an automatic gain control keying signal circuit comprising:
   a source of synchronizing signals comprising pulses of different time duration;
   a source of recurrent pulses normally in a substantially constant phase relationship with said synchronizing signal pulses, said recurrent pulses having a substantially constant time duration which is longer than the shortest duration ones of said synchronizing pulses;
   a latching device including a first transistor having a base electrode coupled to said source of synchronizing signals, an emitter electrode coupled to a source of reference potential, and a collector electrode, and a second transistor having a base electrode coupled to the collector electrode of said first transistor, an emitter electrode coupled to said source of recurrent pulses, and a collector electrode coupled to the base electrode of said first transistor; wherein said first and second transistors are rendered conductive upon the coincidence of a synchronizing pulse and a recurrent pulse, and cease conduction only upon the termination of said recurrent pulse;
   means coupled to said automatic gain control voltage generator for supplying a source of keying signals in response to an enabling signal; and
   means having an input coupled to said first transistor and an output coupled to said keying signal supplying means for enabling said keying signal supplying means when said first and second transistors are conducting current.

5. In an automatic gain control circuit of the type including an automatic gain control voltage generator keyed by a keying signal and responsive to the signal level of synchronizing signal components of a composite video signal for providing a gain control potential, an automatic gain control keying signal circuit comprising:

a source of synchronizing signals comprising pulses of different time duration;

a source of recurrent pulses normally in a substantially constant phase relationship with said synchronizing signal pulses, said recurrent pulses having a substantially constant time duration which is longer than the shortest duration ones of said synchronizing pulses;

a latching device including a first transistor having a base electrode coupled to said source of synchronizing signals, an emitter electrode coupled to a source of reference potential, and a collector electrode, and a second transistor having a base electrode coupled to the collector electrode of said first transistor, an emitter electrode coupled to said source of recurrent pulses, and a collector electrode coupled to the base electrode of said first transistor; wherein said first and second transistors are rendered conductive upon the coincidence of a synchronizing pulse and a recurrent pulse, and cease conductive only upon the termination of said recurrent pulse;

selectively enabled means for coupling said source of recurrent pulses to said automatic gain control voltage generator; and means having an input coupled to said first transistor and an output coupled to said selectively enabled coupling means for enabling said selectively enabled coupling means when said first and second transistors are conducting current.

6. The automatic gain control circuit of claim 5, wherein:

said coupling means comprises a resistor; and said enabling means comprises a third transistor having a base electrode coupled to said first transistor and a collector to emitter path coupled to said resistor, wherein said third transistor is rendered non-conductive in response to conduction by said first and second transistors to permit the coupling of a keying signal to said automatic gain control voltage generator by said resistor.

7. In an automatic gain control circuit of the type including an automatic gain control voltage generator keyed by a keying signal and responsive to the signal level of synchronizing signal components of a composite video signal for providing a gain control potential, an automatic gain control keying signal circuit comprising:

a source of synchronizing signals comprising pulses of different time duration;

a source of recurrent pulses normally in a subtantially constant phase relationship with said synchronizing signal pulses, said recurrent pulses having a substantially constant time duration which is longer than the shortest duration ones of said synchronizing pulses;

means having a first input coupled to said source of synchronizing signals and a second input coupled to said source of recurrent pulses and an output for generating a signal upon the coincidence of a synchronizing pulse and a recurrent pulse;

means having an output coupled to said automatic gain control voltage generator and responsive to said coincidence signal for generating an automatic gain control keying signal upon the coincidence of a synchronizing pulse and a recurrent pulse; and means coupled to said source of recurrent pulses and to the output of said coincidence signal generating means for generating an out-of-lock indication signal upon the occurrence of a recurrent pulse which is not in coincidence with a synchronizing pulse.

8. The automatic gain control circuit of claim 7, wherein:

said automatic gain control keying signal generating means is responsive to said out-of-lock indication signal for preventing the generation of an automatic gain control keying signal.

9. In an automatic gain control circuit of the type including an automatic gain control voltage generator keyed by a keying signal and responsive to the signal level of synchronizing signal components of a composite video signal for providing a gain control potential, an automatic gain control keying signal circuit comprising:

a source of synchronizing signals comprising pulses of different time duration;

a source of recurrent pulses normally in a substantially constant phase relationship with said synchronizing signal pulses, said recurrent pulses having a substantially constant time duration which is longer than the shortest duration ones of said synchronizing pulses;

means having a first input coupled to said source of synchronizing signals and a second input coupled to said source of recurrent pulses and an output for generating a signal upon the coincidence of a synchronizing pulse and a recurrent pulse;

selectively enabled means for coupling said source of recurrent pulses to said automatic gain control voltage generator; and means having an input coupled to said coincidence means and an output coupled to said selectively enabled coupling means for enabling said selectively enabled coupling means in response to said coincidence signal.

10. In an automatic gain control circuit of the type including an automatic gain control voltage generator keyed by a keying signal and responsive to the signal level of synchronizing signal components of a composite video signal for providing a gain control potential, an automatic gain control keying signal circuit comprising:

a source of synchronizing signals comprising pulses of different time duration;

a source of recurrent pulses normally in a substantially constant phase relationship with said synchronizing signal pulses, said recurrent pulses having a substantially constant time duration which is longer than the shortest duration ones of said synchronizing pulses;

a selectively disabled signal path for coupling said recurrent pulses to said automatic gain control voltage generator;

means having a first input coupled to said source of synchronizing signals and a second input coupled to said source of recurrent pulses and an output for generating a signal upon the coincidence of a synchronizing pulse and a recurrent pulse;

a first transistor having a collector to emitter path coupled between said selectively disabled signal path and a source of reference potential, and having a base electrode, wherein current conduction by said first transistor disables said selectively disabled signal path; and selectively disabled means for coupling said recurrent pulses to the base electrode of said first transistor, wherein said selectively disabled coupling means is disabled in response to the generation of a coincidence signal by said coincidence signal generating means, and said recurrent pulses provided by said selectively disabled coupling means cause said first transistor to conduct current.

11. The automatic gain control keying signal circuit of claim 10, further comprising:

a second transistor having an input electrode coupled to said coincidence signal generating means and an output electrode coupled to the base electrode of said first transistor, wherein current conduction by said second transistor inhibits conduction by said first transistor.

12. The automatic gain control keying signal circuit of claim 11, further comprising:

an out-of-sync signal path responsive to recurrent pulses from said selectively disabled coupling means for developing an out-of-sync signal.

* * * * *